United States Patent [19]

Nam

[11] Patent Number: 5,511,028
[45] Date of Patent: Apr. 23, 1996

[54] REDUNDANCY ENABLE CIRCUIT CAPABLE OF ACHIEVING INCREASE IN REPAIR EFFICIENCY

[75] Inventor: Jong G. Nam, Ichonkun, Rep. of Korea

[73] Assignee: Hyundai Electronics Industries Co., Ltd., Rep. of Korea

[21] Appl. No.: 365,029

[22] Filed: Dec. 28, 1994

[30] Foreign Application Priority Data

Dec. 29, 1993 [KR] Rep. of Korea .................. 1993-30851

[51] Int. Cl.⁶ ..................................................... G11C 7/00
[52] U.S. Cl. ...................... 365/200; 365/222; 365/225.7; 365/230.03
[58] Field of Search .............................. 365/200, 230.06, 365/225.7, 222, 230.03

[56] References Cited

U.S. PATENT DOCUMENTS 5,297,102  3/1994  Tanizaki ............................ 365/230.03
5,359,561  10/1994 Sakomura et al. .................. 365/200 X Primary Examiner—Joseph A. Popek
Attorney, Agent, or Firm—Merchant, Gould, Smith, Edell, Welter and Schmidt

[57] ABSTRACT

A redundancy enable circuit of a semiconductor memory device, including an address input unit provided with a plurality of repair fuses and a plurality of pass transistors for respectively receiving address signals necessary and unnecessary for a refresh option, the address input unit allowing the necessary ones of the of the address signals to be inputted respectively at corresponding ones of the pass transistors and thereby to control the signal-received pass transistors while preventing the unnecessary ones of the address signals from being inputted respectively at corresponding ones of the pass transistors, whereby an increased repair efficiency is obtained.

5 Claims, 4 Drawing Sheets

REDUNDANCY ENABLE CIRCUIT CAPABLE OF ACHIEVING INCREASE IN REPAIR EFFICIENCY

TABLE 1

| | RA89 | $\overline{RA89}$ | $RA\overline{89}$ | $\overline{RA}89$ | RAAB | $RA\overline{AB}$ | $RA\overline{AB}$ | $\overline{RAAB}$ | AY0 | $\overline{AY0}$ | AY1 |
|---|---|---|---|---|---|---|---|---|---|---|---|
| 4K Option | RA89 | $\overline{RA89}$ | $RA\overline{89}$ | $\overline{RA}89$ | RAAB | $RA\overline{AB}$ | $RA\overline{AB}$ | $\overline{RAAB}$ | AY0 | $\overline{AY0}$ | AY1 |
| 2K Option | RA89 | $\overline{RA89}$ | $RA\overline{89}$ | $\overline{RA}89$ | RAAB | $RA\overline{AB}$ | $RA\overline{AB}$ | $\overline{RAAB}$ | AY0 | $\overline{AY0}$ | AY1 |

| | $\overline{AY1}$ | AY2 | $\overline{AY2}$ | AY3 | $\overline{AY3}$ | AY4 | $\overline{AY4}$ | AY5 | $\overline{AY5}$ | AY6 | $\overline{AY6}$ | AY7 | $\overline{AY7}$ |
|---|---|---|---|---|---|---|---|---|---|---|---|---|---|
| 4K Option | $\overline{AY1}$ | AY2 | $\overline{AY2}$ | AY3 | $\overline{AY3}$ | AY4 | $\overline{AY4}$ | AY5 | $\overline{AY5}$ | AY6 | $\overline{AY6}$ | AY7 | $\overline{AY7}$ |
| 2K Option | $\overline{AY1}$ | AY2 | $\overline{AY2}$ | AY3 | $\overline{AY3}$ | AY4 | $\overline{AY4}$ | AY5 | $\overline{AY5}$ | AY6 | $\overline{AY6}$ | AY7 | $\overline{AY7}$ |

BACKGROUND OF THE INVENTION

1. Field of the Invention

The present invention relates to a redundancy enable circuit capable of achieving an increase in repair efficiency, and more particularly to a redundancy enable circuit for option-processing input addresses in accordance with a refresh option.

2. Description of the Prior Art

For option-processing of input addresses in accordance with a refresh option, a variety of refresh specifications are needed due to the compatibility required in dynamic random access memories (DRAMs) of 4M grade or greater with other grades, for example, the compatibility of 4M grade with 1M grade and the compatibility of 16M grade with 4M grade. Problems associated with power consumption involved in DRAMs also increase the variety of refresh specifications required.

By way of example, in the case of a 16M×1 DRAM and a 4M×4 DRAMs an option of 2 Kcycle/32 ms, which is the reference refresh of the 16M DRAM, is used. In such a case, an option of 4 Kcycle/64 ms is also used in order to reduce the power consumption. For a case of an 1M×16 DRAM, the option of 2 Kcycle/32 ms which is the reference refresh of the 16M DRAM is used. In order to reduce the power consumption in this case, the option of 4 Kcycle/64 ms is also used. In this case, an option of 1 Kcycle/16 ms is also used for the compatibility with the 4M DRAM. The refresh specification selected in the manner mentioned above, is called a "refresh option".

Referring to FIG. 1 and Table 1, there are illustrated a conventional redundancy circuit and a mapping relation of addresses selected depending on a refresh option.

As shown in FIG. 1, the redundancy enable circuit usable for conventional DRAMs of 16M grade uses block selecting row addresses RA89AB and column addresses AY0 to AY7.

When a global decoder is used, the redundancy circuit cuts off fuses of block selecting row addresses and those of addresses in a block respectively corresponding to failed column addresses. For example, where a 4K refresh option is generated, the refresh circuit cuts off fuses of block selecting addresses RA89 and RAAB and those of column addresses AY0 to AY7 respectively corresponding to failed block addresses RA89AB. For a 2K refresh option, the refresh circuit cuts off fuses of block selecting row addresses RA89 and RAAB and failed ones of column addresses AY0 to Ay7 because the block selecting addresses are RA89A and the column addresses are AY0 to AY8.

Referring to FIG. 2, it can be found that the repair efficiency is reduced by ½ because the block selection is achieved only by RA89A of block selecting addresses RA89AB.

As a result, the conventional redundancy enable circuit involves a problem of a degraded repair efficiency because the conventional repair is achieved by constantly using all addresses transmitted from the redundancy circuit to the repair fuse box irrespective of the refresh option.

SUMMARY OF THE INVENTION

Therefore, an object of the invention is to eliminate a degradation in repair efficiency of a DRAM of 4M grade or greater caused by a refresh option in a case of using a global decoder and, thus, to provide a redundancy enable circuit capable of achieving an increase in repair efficiency by appropriately option-processing an input address in accordance with a refresh option.

In accordance with the present invention, this object can be accomplished by providing a redundancy enable circuit of a semiconductor memory device, comprising: address input means including a plurality of repair fuses and a plurality of pass transistors for respectively receiving address signals, certain of the address signals being unnecessary for a particular refresh option being used. The address input means allows the necessary address signals to be inputted respectively at corresponding ones of the pass transistors to thereby control the signal-received pass transistors while preventing the unnecessary address signals from being inputted respectively at corresponding ones of the pass transistors, whereby an increased repair efficiency is obtained.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 3 to 8 illustrate a redundancy enable circuit capable of achieving an increase in repair efficiency in accordance with the present invention.

A degradation in repair efficiency is caused by the fact that an unnecessary address generated due to a repair option and a necessary address newly generated are subjected to processing.

Accordingly, the repair efficiency is not degraded by appropriately option-processing addresses inputted at the redundancy circuit in accordance with the refresh option.

Figure 3:
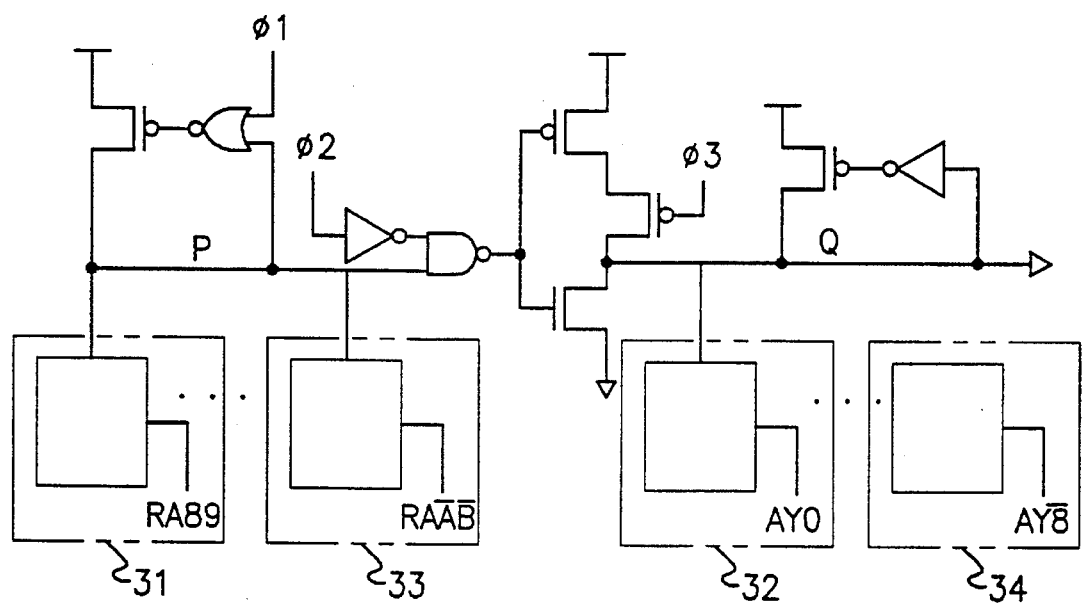
FIG. 3 is a circuit diagram illustrating a redundancy enable circuit in accordance with the present invention.

FIG. 3 is a circuit diagram illustrating the redundancy enable circuit in accordance with the present invention. As shown in FIG. 3, the redundancy enable circuit includes a block row address input unit 31 and a column address input unit 32 for always inputting constant addresses irrespective of a selected refresh option. Input units 31 and 32 have the same constructions as those of the conventional redundancy enable circuit. In addition to the input units 31 and 32, the redundancy enable circuit of the present invention includes a block row address input unit 33 and a column address unit input 34 for inputting addresses selected depending on the refresh option, respectively.

Figure 4:
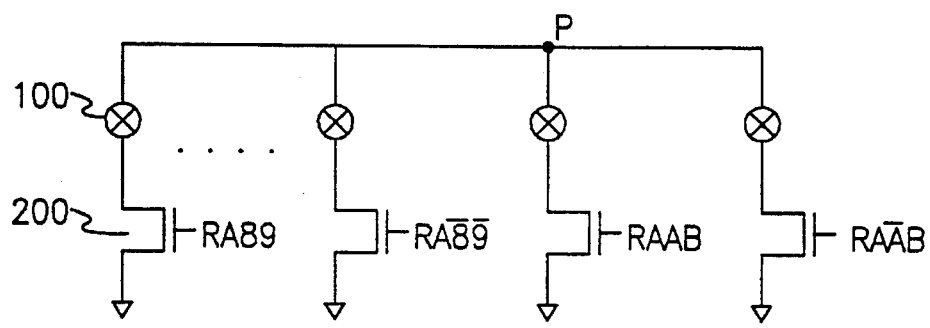
FIG. 4 is a circuit diagram of a block row address input unit adapted to always input constant addresses irrespective of the refresh option in accordance with the present invention.

FIG. 4 is a circuit diagram of the block row address input unit 31 adapted to always input constant addresses irrespective of the refresh option. As shown in FIG. 4, the block row address input unit 31 includes a plurality of fuse boxes 100 and a plurality of pass transistors 200 for inputting block selecting row address signals RA89 to $\overline{RA89}$, RAAB and $\overline{RAAB}$ at their gate terminals, respectively. Each of the pass transistors 200 is controlled to be connected to a corresponding one of the fuse boxes 100 upon receiving a corresponding one of the block selecting row address signals.

Figure 5:
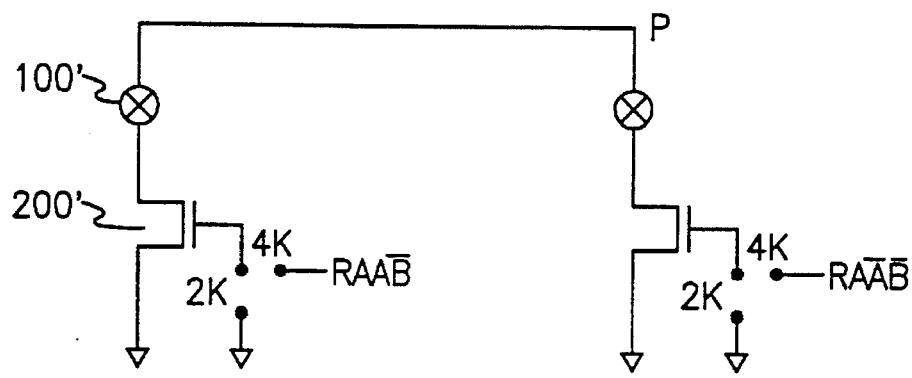
FIG. 5 is a circuit diagram of a block selecting row address input unit adapted to input an address selected depending on the refresh option in accordance with the present invention.

FIG. 5 is a circuit diagram of the block selecting row address input unit 33 adapted to input an address selected depending on the refresh option. As shown in FIG. 5, the block selecting row address input unit 33 includes a pair of fuse boxes 100' and a pair of pass transistors 200' for inputting block selecting row address signals $RA\overline{AB}$ and $RA\overline{AB}$ at their gate terminals in accordance with the refresh option, respectively. Each of the pass transistors 200' is controlled to be connected to a corresponding one of the fuse boxes 100' upon receiving a corresponding one of the block selecting row address signals. For example, the gate terminals of the transistors 200' are connected to a ground voltage Vss for a 2K option. For a 4K option, address signals $RA\overline{AB}$ and $RA\overline{AB}$ are inputted at the transistors 200', thereby causing the transistors 200' to be connected to the fuse boxes 100', respectively.

As the input addresses respectively received in the fuses 100' and the transistors 200' are appropriately processed in accordance with the refresh option, it is possible to process tile refresh option without any reduction in repair efficiency.

Figure 6:
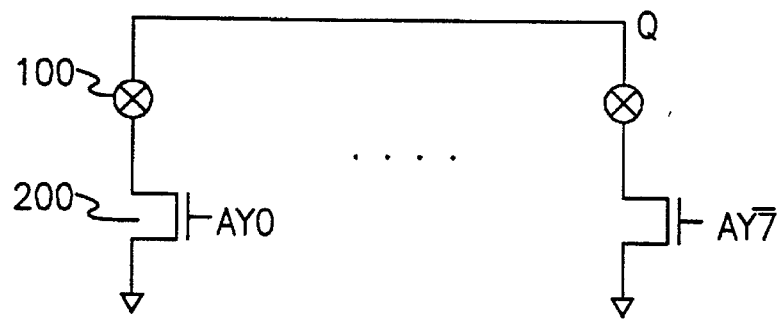
FIG. 6 is a circuit diagram of a column address input unit adapted to always input constant addresses irrespective of the refresh option in accordance with the present invention.

FIG. 6 is a circuit diagram of the column address input unit 32 adapted to always input constant addresses irrespective of the refresh option. As shown in FIG. 6, the column address input unit 32 includes a plurality of fuse boxes 100 and a plurality of transistors 200 for inputting block selecting column address signals AY0 to $Ay\overline{7}$ at their gate terminals, respectively. Each of the pass transistors 200 is controlled to be connected to a corresponding one of the fuse boxes 100 upon receiving a corresponding one of the block selecting column address signals.

Figure 7:
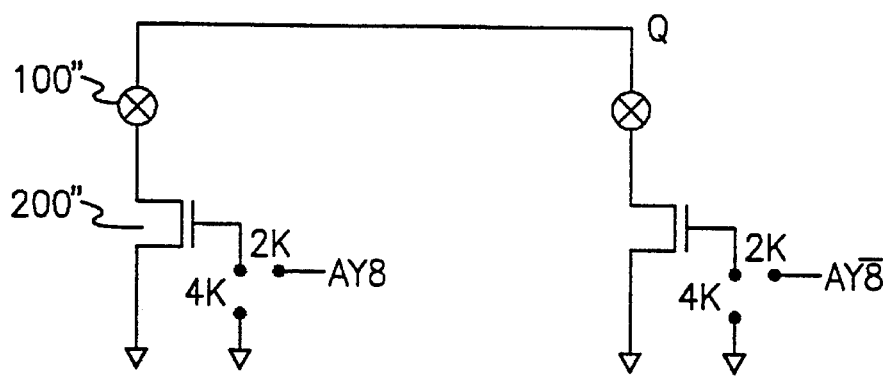
FIG. 7 is a circuit diagram of a block selecting column address input unit adapted to input addresses selected depending on the refresh option.

FIG. 7 is a circuit diagram of the block selecting column address input unit 34 adapted to input addresses selected depending on the refresh option. As shown in FIG. 7, the block selecting column address input unit 34 includes a pair of fuse boxes 100" and a pair of pass transistors 200" for inputting block selecting column address signals AY8 and $\overline{AY8}$ at their gate terminals in accordance with the refresh option, respectively. Each of the pass transistors 200" is controlled to be connected to a corresponding one of the fuse boxes 100" upon receiving a corresponding one of the block selecting column address signals. For example, the gate terminals of the transistors 200" are connected to a ground voltage Vss for a 4K option. For a 2K option, address signals AY8 and $\overline{AY8}$ are inputted at the transistors 200", thereby causing the transistors 200" to be connected to the fuse boxes 100", respectively.

Figure 8:
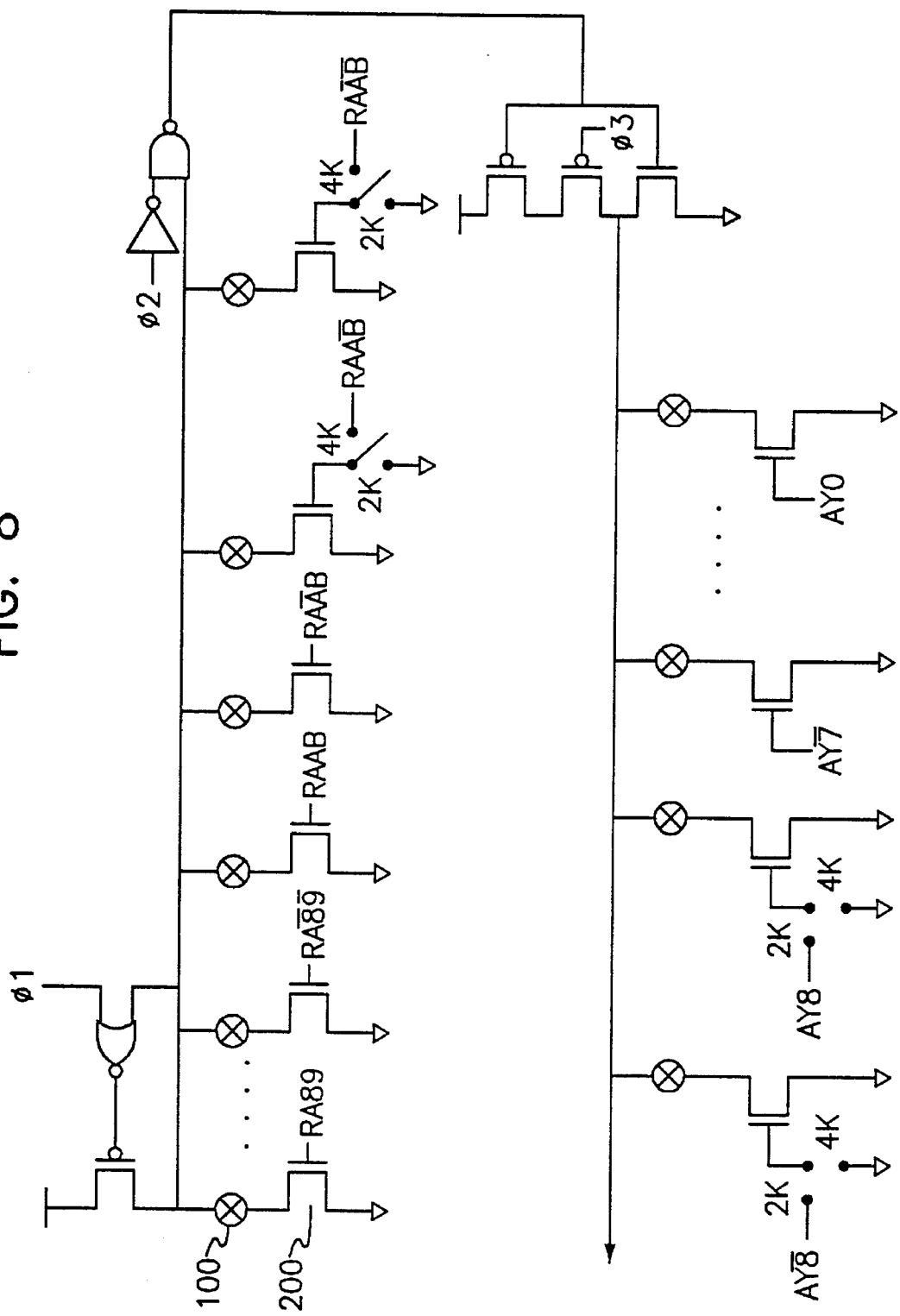
FIG. 8 is a circuit diagram illustrating the redundancy enable circuit of FIG. 3 under a condition that blocks of FIG. 3 are substituted by circuits shown in FIGS. 5 to 7, respectively.

FIG. 8 is a circuit diagram illustrating the redundancy enable circuit of FIG. 3 under a condition that blocks of FIG. 3 are substituted by circuits shown in FIGS. 5 to 7, respectively. Table 2 shows block selecting row address signals and column selecting address signals generated for the 4K refresh option and block selecting row address signals and column selecting address signals generated for the 2K refresh option.

TABLE 2

|  | RA89 | $\overline{RA89}$ | $RA\overline{89}$ | $\overline{\overline{RA89}}$ | RAAB | $\overline{RAAB}$ | $RA\overline{AB}$ | $\overline{RA\overline{AB}}$ | AY0 | $\overline{AY0}$ | AY1 | $\overline{AY1}$ | AY2 |
|---|---|---|---|---|---|---|---|---|---|---|---|---|---|
| 4K Option | RA89 | $\overline{RA89}$ | $RA\overline{89}$ | $\overline{\overline{RA89}}$ | RAAB | $\overline{RAAB}$ | $RA\overline{AB}$ | $\overline{RA\overline{AB}}$ | AY0 | $\overline{AY0}$ | AY1 | $\overline{AY1}$ | AY2 |
| 2K Option | RA89 | $\overline{RA89}$ | $RA\overline{89}$ | $\overline{\overline{RA89}}$ | RAAB | $\overline{RAAB}$ | $V_{ss}$ | $V_{ss}$ | AY0 | $\overline{AY0}$ | AY1 | $\overline{AY1}$ | AY2 |

|  | $\overline{AY2}$ | AY3 | $\overline{AY3}$ | AY4 | $\overline{AY4}$ | AY5 | $\overline{AY5}$ | AY6 | $\overline{AY6}$ | AY7 | $\overline{AY7}$ | AY8 | $\overline{AY8}$ |
|---|---|---|---|---|---|---|---|---|---|---|---|---|---|
| 4K Option | $\overline{AY2}$ | AY3 | $\overline{AY3}$ | AY4 | $\overline{AY4}$ | AY5 | $\overline{AY5}$ | AY6 | $\overline{AY6}$ | AY7 | $\overline{AY7}$ | $V_{ss}$ | $V_{ss}$ |

TABLE 2-continued

| 2K Option | $\overline{AY2}$ | AY3 | $\overline{AY3}$ | AY4 | $\overline{AY4}$ | AY5 | $\overline{AY5}$ | AY6 | $\overline{AY6}$ | AY7 | $\overline{AY7}$ | AY8 | $\overline{AY8}$ |
|---|---|---|---|---|---|---|---|---|---|---|---|---|---|

For the 4K refresh option, address signals RA89 to RA$\overline{89}$ and RAAB to RA$\overline{AB}$ are applied as block selecting row address signals, respectively, whereas address signals AY0 to Ay$\overline{7}$ are inputted as column selecting address signals, respectively. In this case, the ground voltage Vss is applied to the address input unit adapted to receive the column selecting address signals AY8 and AY$\overline{8}$, respectively.

Figure 1:
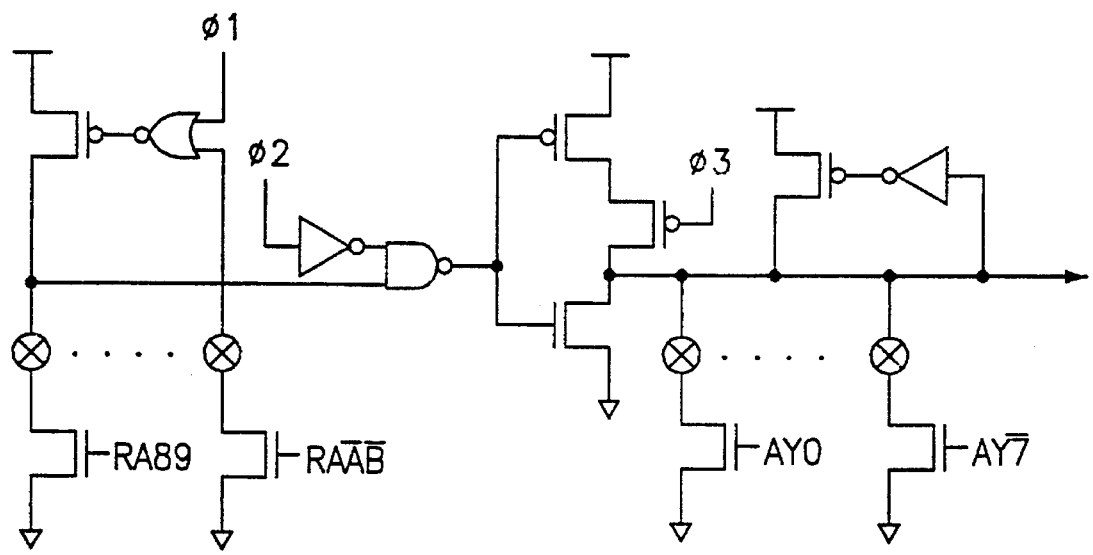
FIG. 1 is a circuit diagram illustrating a conventional redundancy enable circuit.
Figure 2:
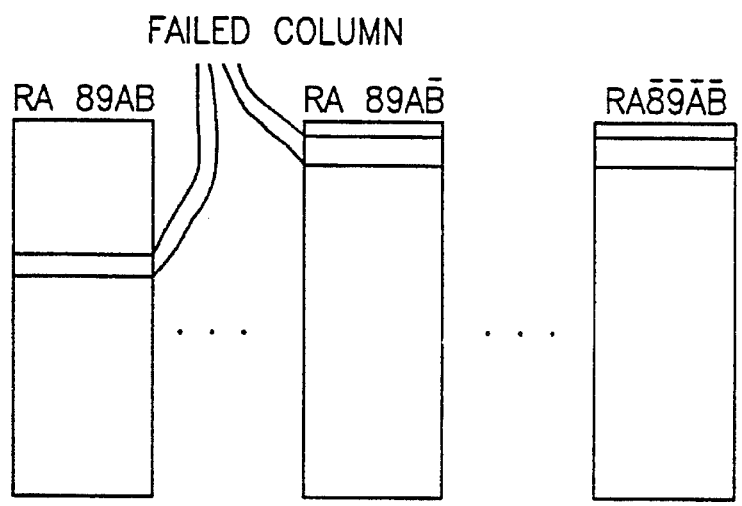
FIG. 2 is a diagram of memory blocks illustrating a conventional column repair method.

If addresses failed in this case are RA$\overline{89}$A$\overline{B}$ and AY0 $\overline{1234567}$, fuses respectively corresponding to addresses RA$\overline{89}$, RAA$\overline{B}$, AY0, AY$\overline{1}$, AY$\overline{2}$, AY3, AY4, AY$\overline{5}$, AY6 and Ay7 are cut off. In this case, however, fuses respectively corresponding to addresses AY8 and AY$\overline{8}$ are not cut off because the ground voltage Vss is applied to the address input unit adapted to receive the addresses. Block selecting row addresses for the 2K refresh are addresses RA89 to RA$\overline{89}$, RAAB and RA$\overline{AB}$, as shown in FIG. 2. In this case, column selecting addresses are addresses AY0 to Ay$\overline{7}$, whereas column addresses are addresses AY8 and AY$\overline{8}$. In other words, address signals RA89 to RA$\overline{89}$, RAAB and RA$\overline{AB}$ are inputted as the block selecting row addresses for the 2K refresh option. In this case, the ground voltage Vss is applied to the address input unit adapted to receive the address signals RA$\overline{AB}$ and RA$\overline{AB}$.

Address signals AY0 to AY$\overline{7}$ are inputted as column selecting addresses, respectively, while AY8 to AY$\overline{8}$ are inputted as block selecting column addresses, respectively.

If addresses failed in this case are addresses RA$\overline{89}$, RAA and AY0$\overline{12345678}$, fuses respectively corresponding to AY0, AY$\overline{1}$, AY$\overline{2}$, AY3, AY4, AY$\overline{5}$, AY6, Ay7 and AY8 are cut off. In this case, however, fuses respectively corresponding to the address RAA$\overline{B}$ and RA$\overline{AB}$ are not cut off because the ground voltage Vss is applied to the address input unit adapted to the addresses.

As addresses are appropriately option-processed in accordance with the refresh option in a manner as mentioned above, any reduction in repair efficiency can be obtained.

As apparent from the above description, the present invention provides a redundancy enable circuit capable of achieving an increase in repair efficiency by appropriately using addresses inputted at the circuit in accordance with a refresh option.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A redundancy enable circuit of a semiconductor memory device, comprising:

address input means, including a plurality of repair fuses and a plurality of pass transistors respectively connected to the plurality of repair fuses, for respectively receiving address signals including address signals which are necessary for a refresh option and address signals which are unnecessary for the refresh option, the address input means allowing the necessary address signals to be inputted respectively at corresponding ones of the pass transistors to thereby control the pass transistors to which the address signals are inputted while preventing the unnecessary address signals from being inputted respectively at corresponding ones of the pass transistors, whereby an increased repair efficiency is obtained.

2. A redundancy enable circuit in accordance with claim 1, wherein the address input means applies a ground voltage to the pass transistors, respectively corresponding to the unnecessary address signals for the refresh option.

3. A redundancy enable circuit in accordance with claim 1, wherein the address signals are block selecting row address signals or block selecting column address signals.

4. An address input circuit for use in a redundancy enable circuit of a semiconductor memory device operable in a selected one of a plurality of refresh options, the address input circuit comprising:

a plurality of repair fuses;

a plurality of pass transistors each having a control gate and being respectively coupled to the plurality of repair fuses, each of the pass transistors being coupled to receive a corresponding one of a plurality of address signals at the control gate, the address signals including address signals which are used for a selected refresh option and address signals which are not used for the selected refresh option; and control means for allowing an address signal used for the selected refresh option to be applied to the control gate of its corresponding pass transistor and for preventing an address signal not used for the selected refresh option from being applied to the control gate of its corresponding pass transistor such that repair efficiency of the redundancy enable circuit is increased.

5. An address input circuit as recited in claim 4, wherein the control means comprises means for connecting the control gate of the pass transistor corresponding to the address signal not used for the selected refresh option to ground.

* * * * *